(12) United States Patent
Kovarik et al.

(10) Patent No.: US 6,950,030 B2
(45) Date of Patent: Sep. 27, 2005

(54) BATTERY CHARGE INDICATING CIRCUIT

(75) Inventors: Illya Kovarik, Chicago, IL (US); George R. Gawell, Buffalo Grove, IL (US)

(73) Assignee: Credo Technology Corporation, Wilmington, DE (US)

(*) Notice: Subject to any disclaimer, the term of this patent is extended or adjusted under 35 U.S.C. 154(b) by 311 days.

(21) Appl. No.: 10/235,738

(22) Filed: Sep. 5, 2002

(65) Prior Publication Data

US 2004/0046673 A1 Mar. 11, 2004

(51) Int. Cl.[7] .............................................. G08B 21/00
(52) U.S. Cl. ........................ 340/636.1; 340/815.4; 340/815.58; 340/815.65; 324/425
(58) Field of Search ................... 340/636.1, 636.15, 340/815.4, 815.58, 815.65; 324/425

(56) References Cited

U.S. PATENT DOCUMENTS

| | | | |
|---|---|---|---|
| 3,952,239 A | 4/1976 | Owings et al. | |
| 4,010,456 A | 3/1977 | Erni | |
| 4,027,231 A | * 5/1977 | Lohrmann | 324/433 |
| 4,050,003 A | 9/1977 | Owings et al. | |
| 4,383,212 A | * 5/1983 | Ballman | 320/158 |
| 4,412,168 A | 10/1983 | Sell | |
| 4,563,629 A | 1/1986 | Keiper | |
| 4,956,892 A | 9/1990 | Fawkes | |
| 5,015,544 A | 5/1991 | Burroughs et al. | |
| 5,144,217 A | 9/1992 | Gardner et al. | |
| 5,148,095 A | 9/1992 | Miller et al. | |
| 5,156,931 A | 10/1992 | Burroughs et al. | |
| 5,293,156 A | * 3/1994 | Shoji et al. | 340/636.1 |
| 5,478,665 A | 12/1995 | Burroughs et al. | |
| 5,614,807 A | * 3/1997 | Duley | 340/636.15 |
| 5,714,932 A | 2/1998 | Castellon et al. | |
| 5,789,100 A | 8/1998 | Burroughs et al. | |
| 5,805,068 A | 9/1998 | Bradus | |
| 5,929,597 A | 7/1999 | Pfeifer et al. | |
| 5,933,010 A | 8/1999 | Moreno | |
| 6,075,341 A | 6/2000 | White et al. | |
| 6,107,802 A | 8/2000 | Matthews et al. | |
| 6,121,755 A | 9/2000 | Nowak et al. | |
| 6,191,554 B1 | 2/2001 | Nakane et al. | |
| 6,229,266 B1 | * 5/2001 | Van Velzen et al. | 315/169.3 |
| 6,324,339 B1 | 11/2001 | Hudson et al. | |
| 6,443,675 B1 | * 9/2002 | Kopras et al. | 409/182 |
| 6,483,275 B1 | * 11/2002 | Nebrigic et al. | 320/135 |

FOREIGN PATENT DOCUMENTS

JP 58102166 A * 6/1983 ......... G01R/19/165

* cited by examiner

Primary Examiner—Daniel Wu
Assistant Examiner—Samuel J. Walk
(74) Attorney, Agent, or Firm—Greer, Burns & Crain, Ltd.

(57) ABSTRACT

A voltage indicator circuit for indicating a charge state of a power supply, such as a battery pack, is disclosed. The voltage indicator circuit includes a voltage divider circuit that connects to a plurality of series connected light sources, such as light emitting diodes. Upon activation of the voltage divider circuit, one or more of the light sources may illuminate to provide a visual indication of the current charge state of the power supply. More particularly, the number of light sources illuminated varies according to the charge state of the battery pack.

20 Claims, 3 Drawing Sheets

BATTERY CHARGE INDICATING CIRCUIT

BACKGROUND OF THE INVENTION

The present invention relates generally to electronics, and more specifically relates to a circuit for indicating a charge state of a battery pack used with battery power driven devices.

There has been continued innovation in the field of battery packs, and especially rechargeable battery packs that are used with portable devices, such as cordless power tools. Examples of such rechargeable battery packs are those produced under the SKIL and BOSCH brands by the S-B Power Tool Corporation of Chicago, Ill., which are used with various cordless power tools also produced under the same brands. A typical rechargeable battery pack ordinarily has a generally rectangular housing and a male stem connector extending from a surface thereof. These battery packs commonly have an associated battery charger that is correspondingly sized and configured to contain a female slot for receiving the male stem connector of the battery pack. The battery packs are further equipped with terminals for establishing electrical contact with associated mating terminals of the battery charger, or alternatively battery power driven devices.

For many devices using rechargeable battery packs, such devices are provided as a kit and often include, in addition to the device itself, two battery packs and a single battery charger. Having multiple battery packs of a given type enables the user to continuously use the cordless power tool by swapping out depleted battery packs for filly charged battery packs. A common problem for users of such kits, however, is determining the charge states of the battery packs. In some instances, operators may have not used the kits in some time, and thus are unsure of the charge state of the battery packs and may charge filly charged battery packs. At other times, unless the battery packs are discharged resulting in the device being inoperable, operators may be unsure of when battery packs need to be recharged. This can result in the battery packs being charged unnecessarily.

For many types of rechargeable battery packs, such as those using Nickel-Cadmium (NiCd) batteries, it is desirable to deplete an existing charge of the battery pack prior to its recharging to extend the battery pack's lifetime. Moreover, it is also desirable to extend a battery pack's lifetime by limiting the number of times the battery pack is recharged. Heavy users of such battery packs would benefit from an indicator of a charge state of the battery pack. Such users would be able to perform optimal charging of the battery packs and minimize excessive charging by adjusting their charging time according to an indicated charge state.

SUMMARY OF THE INVENTION

The present invention relates to power sources that are used with portable devices, such as cordless power tool battery packs. The present invention has a power source voltage indicator circuit that may be coupled to a battery pack to provide an indication of a charge state of the battery pack. In one embodiment, the power source voltage indicator circuit includes a voltage divider circuit having a plurality of series connected light sources coupled thereto. Different combinations of the serially connected light sources are illuminated (or not illuminated) based on the charge state of the battery pack, notifying a user of the battery pack's current charge state.

DETAILED DESCRIPTION OF THE INVENTION

The present invention is directed to a voltage indicating circuit for use with a power source, such as a battery pack. Generally, many portable devices are powered by rechargeable battery packs that require intermittent charging throughout the lifetime of the battery packs. In order to provide optimal charging to these battery packs, different embodiments of voltage indicating circuits are disclosed herein which provide a visual display indicating a relative voltage level of a battery pack upon user activation of a switch. Preferably, the visual display is provided by light emitting diodes (LED's) that emit light in different combinations according to the relative voltage level of the battery pack.

Figure 1:
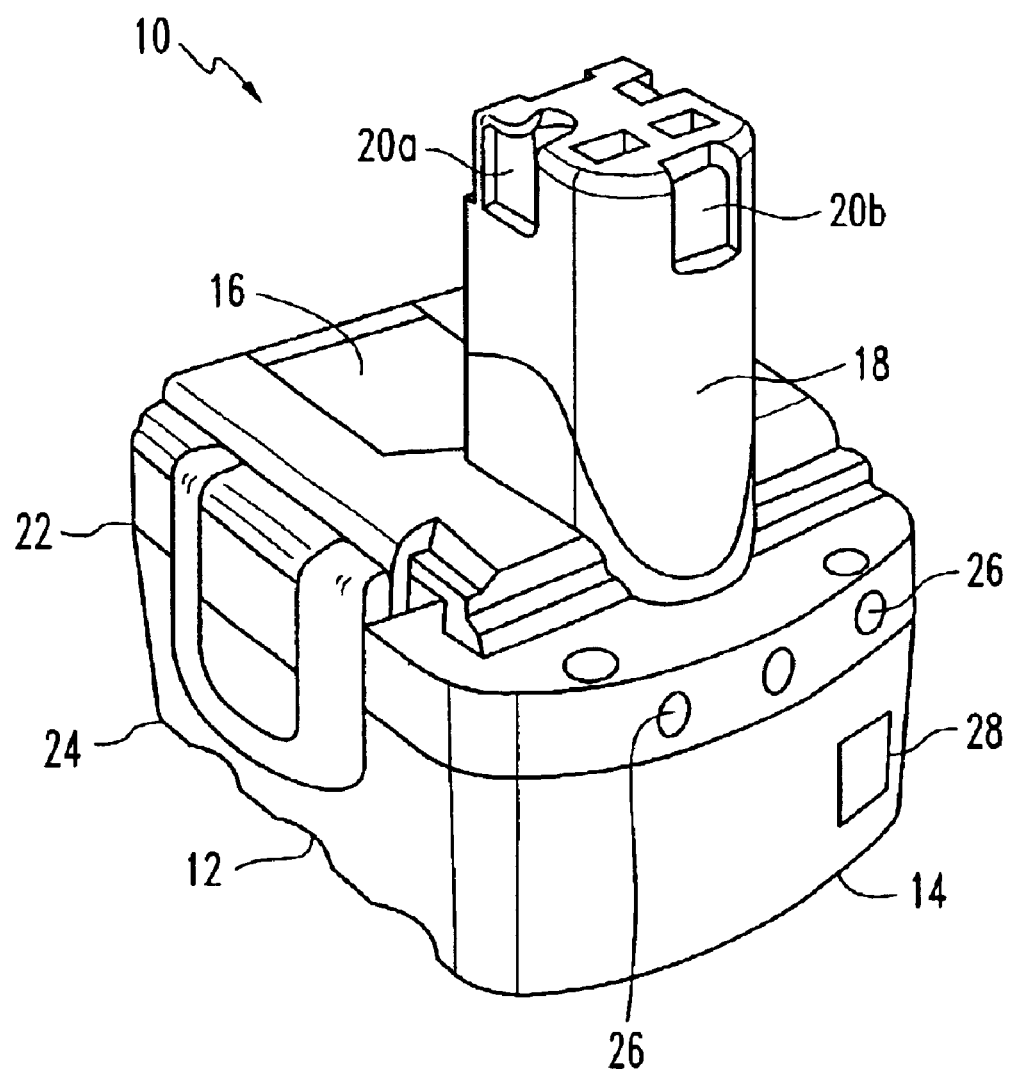
FIG. 1 is a perspective view of one embodiment of a battery pack having a voltage indicator circuit.

Turning now to FIG. 1, one embodiment of a battery having a charge indicating circuit, formed as a battery pack, is indicated generally at 10. The battery pack 10 includes a generally rectangular housing 12 having a bottom surface portion 14 and a top surface portion 16. Disposed on the top surface portion 16 is a male stem 18. The male stem 18 has power terminals 20a and 20b that electrically connect to a battery charger (not shown) during charging of the battery pack 10, or alternatively to a load (e.g., a power tool, which is also not shown) for providing power to the load. The terminals 20a–b are operable to receive the two polarities of the battery and are preferably made of metal, but it is contemplated that the terminals may be made from any electrically conductive material typically used in batteries. A switch 22 may also be included to mechanically disengage the battery pack 10 from the battery charger and/or load.

While the instant invention contemplates use of circuitry capable of charging different light sources, circuit diagrams for detecting a battery pack charge state using LED's are shown and will be described. Very generally, the voltage indicating circuitry, designated generally at 24, senses the relative charge of the battery pack 10, and is capable of providing a visual signal via light sources indicating the current charge state of a battery pack 10 that is connected thereto. A preferred example of this visual feedback is a plurality of LED's 26 connected to the housing 12 of the battery pack 10.

The voltage or battery charge indicating circuit 24, shown positioned within the housing 12, may be integrated with or connected to the battery pack 10 in a variety of ways as is known to those skilled in the art. In one embodiment, the voltage indicating circuit 24 includes a plurality of light sources 26 that are connected to the housing 12. A push button switch 28 controls electric current flow between the battery pack 10 and the voltage indicating circuit 24. In an open position, i.e., the switch 28 not depressed or otherwise activated by a user, the switch prevents a flow of electric current (i.e., power) through the voltage indicator circuit 24 to limit power loss. In a closed position, the switch 28 permits electric current flow from the battery pack 10 through the voltage indicating circuit 24 to enable a user to assess the current charge state of the battery pack.

Figure 2:
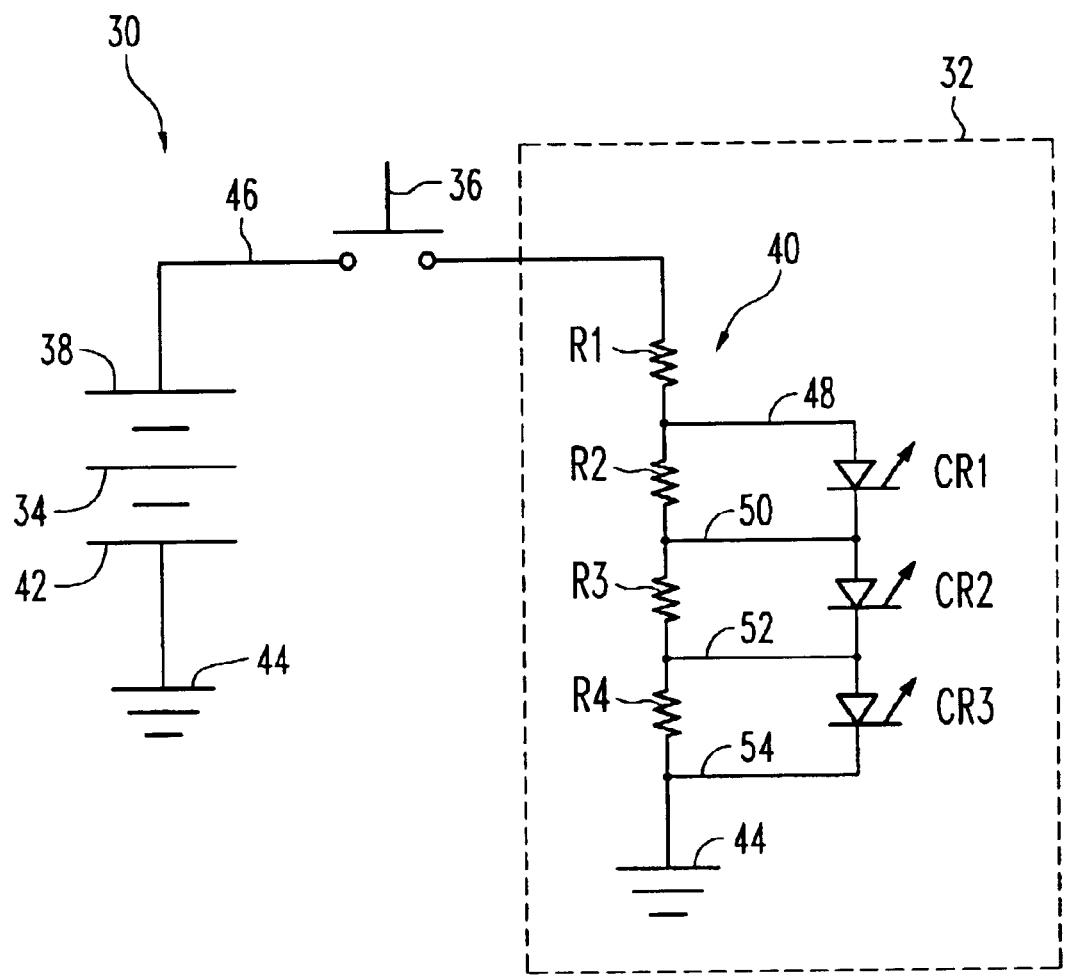
FIG. 2 is a circuit schematic diagram of one embodiment of a battery pack having a voltage indicator circuit.

Referring now to FIG. 2, there is illustrated a circuit schematic diagram of one embodiment of a battery pack, generally designated as 30, having a voltage indicator circuit 32 that is connected to a battery power source 34. A switch 36, preferably a push button switch, is connected in series between the battery 34 and the voltage indicator circuit 32. In an open position, as shown, the switch 36 prevents a flow of electric current from a positive terminal 38 of the battery 34 to a voltage divider circuit 40 formed by a resistor ladder of four resistors R1–R4 series connected to each other.

In alternative embodiments, the switch 36 can be replaced with other electrical components that connect the battery 34 to the voltage indicator circuit 32. The battery 34 has a low voltage terminal 42 that connects to a ground 44, and a high voltage node 46 that connects to the switch 36. When the switch 36 is closed by user interaction, electric power is provided by the battery 34 to the voltage indicator circuit 32. In addition to the voltage divider circuit 40, the voltage indicator circuit 32 preferably includes three series connected LED's CR1–CR3 that are connected to the voltage divider circuit. In alternative embodiments, it is contemplated that other light sources connected in series with resistors may be substituted for each of the LED's to indicate a charge state of the battery 34.

Turning again to FIG. 2, a node 48 of the voltage indicator circuit 32 connects a resistor R1 to a resistor R2 and the anode of LED CR1. In a similar fashion, a node 50 connects a resistor R2 to a resistor R3, the anode of LED CR2, and the cathode of LED CR1; and a node 52 connects a resistor R3 to a resistor R4, the anode of LED CR3, and the cathode of LED CR2. In this configuration, the LED's CR1–CR3 have at least one resistor from the voltage divider circuit 40 that is in parallel to each of the LED's. In addition to nodes 48–52 connecting the voltage divider circuit 40 to the LED's CR1–CR3, a grounded node 54 connects an output of resistor R4 to an output of LED CR3.

In one embodiment, the battery 34 is selected as a 9.6V battery and resistors R1–R4 are selected to have resistance values of 330, 150, 200, and 330 ohms, respectively. In other embodiments using rechargeable batteries, it is contemplated that such batteries are generally 30V or less, although voltages in excess of 30V may be used with the present invention. The resistors R1–R4 are preferably 0.25 watt, 5% carbon film resistors.

Upon a momentary user activation of the switch 36, the LED's CR1–CR3 are all illuminated to provide a visual signal when the battery 34 is fully charged. The LED's CR1–CR3 continue to be illuminated until the battery loses charge and reaches a cutoff voltage of 9.4V, at which point there is not enough voltage across LED CR1 to illuminate the LED. Similarly, once a cutoff voltage of 7.5V at the node 48 is reached, LED's CR1 and CR2 are no longer illuminated. Finally, at a cutoff voltage of 5.1V at the node 48, all LED's CR1–CR3 are turned off.

In operation, user activation of the switch 36 enables the relative charge state of the battery 34 to be displayed. If all LED's CR1–CR3 are illuminated, the battery 34 is in a high charge state. Two illuminated LED's CR2–CR3 indicates a medium charge state of the battery 34, and one illuminated LED CR3 indicates a low charge state. If no LED's CR1–CR3 are illuminated, then the battery 34 has a very low charge and is in a discharged state, which generally requires a recharging of the battery prior to further use as a power source. An advantage of providing the LED's CR1–CR3 in series, as compared to a parallel arrangement, is that as the voltage of the battery 34 decreases, successive LED's will cease to illuminate, and will thereby provide an accurate indication of the current charge state of the battery. Moreover, if the current charge state of a battery 34 is at a medium charge state, for example, then a user can charge such a battery for a shorter time period to minimize unnecessary charging of the battery.

Figure 3:
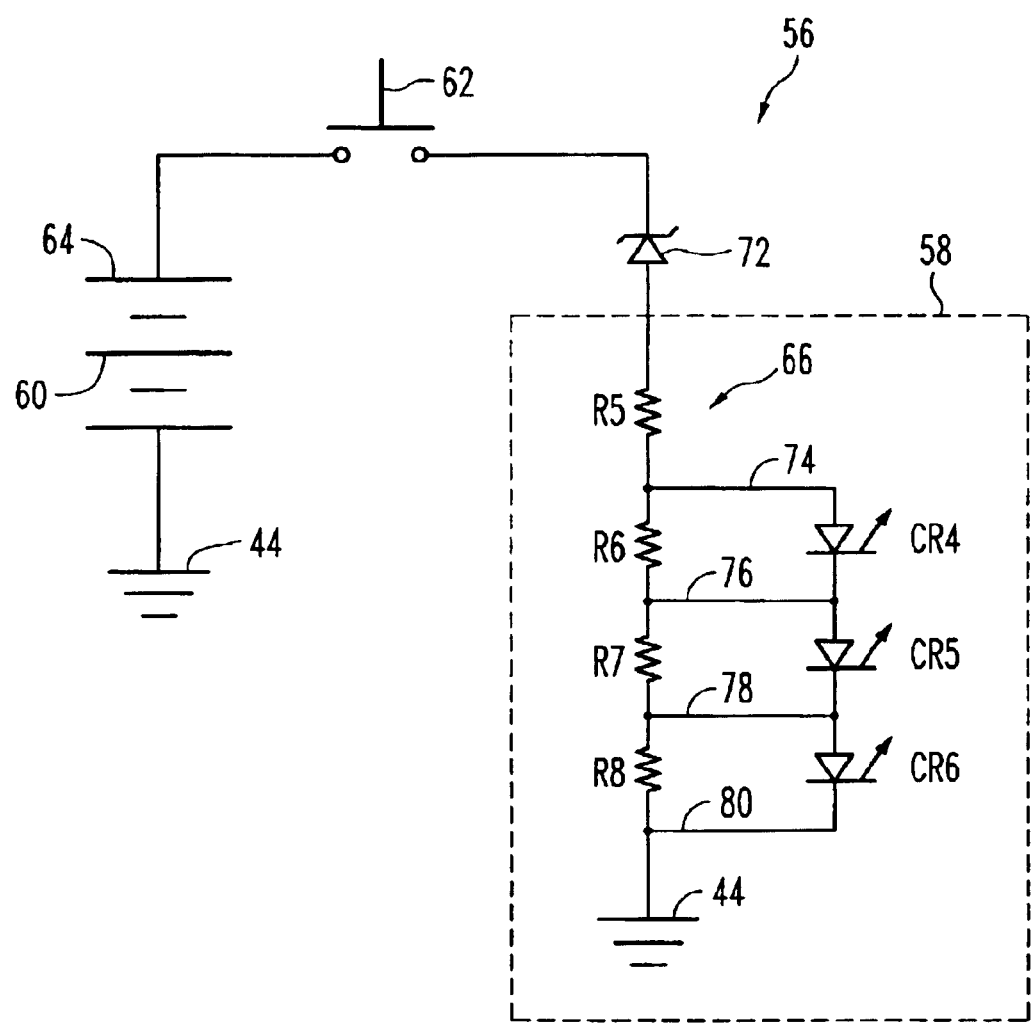
FIG. 3 is a circuit schematic diagram of another embodiment of a battery pack having a voltage indicator circuit.

Referring now to FIG. 3, an alternative embodiment of a circuit schematic diagram 56 of a battery pack is illustrated and includes a voltage indicator circuit 58 connected to a 14.4 V battery power source 60. Similar to FIG. 2, a ground is indicated by the reference numeral 44. A switch 62, also similar to the switch 36 of FIG. 2 controls a flow of electric current between a positive terminal 64 of the battery 60 and the voltage indicator circuit 58. A voltage divider circuit 66 is formed by a resistor ladder of four resistors R5–R8 preferably having resistance values of 180, 200, 390, and 1000 ohms, respectively, that are series connected to each other. The resistors R5–R8 are preferably 0.25 watt, 5% carbon film resistors.

A 6.2V zener diode 72 is connected in series with the switch 62 and the voltage indicator circuit 58 to provide a consistent voltage drop in the circuit 56. Upon the switch 62 being closed by user activation, electric power from the battery 60 is applied to the voltage indicator circuit 58. Similar to the configuration of FIG. 2, the voltage indicator circuit 58 preferably includes three serially connected LED's CR4–CR6 that are connected to the voltage divider circuit 66. That is, a node 74 of the voltage indicator circuit 58 connects the resistor R5 to the resistor R6 and the anode of LED CR4. Likewise, a node 76 connects the resistor R6 to the resistor R7, the cathode of LED CR4, and the anode of LED CR5; and a node 78 connects the resistor R7 to the resistor R8, the cathode of LED CR5, and the anode of LED CR6. In this configuration, the LED's CR4–CR6 have at least one resistor from the voltage divider circuit 66 that is in parallel to each of the LED's. In addition to nodes 74–78 connecting the voltage divider circuit 66 to the LED's CR4–CR6, a grounded node 80 connects an output of resistor R8 to the cathode of LED CR6 and to ground 44.

Upon a momentary user activation of the switch 62, the LED's CR4–CR6 are illuminated when the battery 60 is fully charged to approximately 14.4V. The zener diode 72 reduces the battery voltage from approximately 14.4V to approximately 8.2V, which is then provided to the voltage indicator circuit 58. Since a voltage differential of approximately 2.0V is preferred across each of the LED's CR4–CR6, the zener diode 72 facilitates such a voltage differential. The use of a particular voltage rated zener diode will depend on the fully charged voltage of the battery 60. By way of example, if a 12V battery is used in the circuit 56, then a 5.1V zener diode may be inserted in place of the 6.2V zener diode 72 to provide approximately a 6.9V voltage to the voltage indicator circuit 58. The use of a zener diode rather than a resistor is more desirable since a voltage drop across a resistor would vary as the battery is discharged, whereas the voltage drop across the zener diode remains constant. Preferably, it is desirable to have a voltage drop across each of the LED's CR4–CR6 of approximately 2.0V to illuminate all of the LED's. In alternative embodiments using other light sources, resistors may be included in series with the light sources to approximate the 2.0V voltage drop across each of the light sources.

In operation, momentary user activation of the switch 62 enables the relative charge state of the battery 60 to be displayed. The LED's CR4–CR6 continue to be illuminated until the battery 60 loses charge and reaches a cutoff voltage of approximately 13.3V, at which point there is not enough voltage across LED CR4 to illuminate the LED. If a cutoff voltage of approximately 11.3V is reached, then LED's CR4 and CR5 are no longer illuminated. Eventually, with further discharging of the battery 60, a cutoff voltage of approximately 9.2V is reached which results in all of the LED's CR4–CR6 being turned off.

Although a 6.2V zener diode 72 has been described in the present invention, it is contemplated that other zener diodes and/or electrical components capable of performing similar functions may be substituted herein and are considered within the scope of the present invention. By way of example, a 5.1V zener diode may be substituted for the 6.2V zener diode to provide cutoff voltages of approximately 12.0V, 9.9V, and 7.3V. An advantage of substituting differently rated zener diodes is that the cutoff voltages can be manipulated according to desired design characteristics for specified battery voltages. Likewise, resistance values of the resistors may be varied to adjust cutoff values of the LED's. Moreover, a different number of LED's and resistors (e.g., four LED's connected to five resistors) may be used in combination with different voltage rated zener diodes to provide additional or fewer indicating tiers of battery charge status.

Furthermore, although the voltage indicator circuits provided herein are generally described with reference to rechargeable battery packs, such circuits may be used with disposable batteries, or rechargeable batteries inserted into a power source housing that is configured to transfer power from the inserted batteries as is known to those skilled in the art. Moreover, while the voltage indicator circuits are illustrated as an enclosed circuit within a battery pack, the voltage indicator circuits can be formed as separate modules connectable to a battery pack, which would eliminate the need to have a switch since user attachment and detachment of the separate modules to the battery pack could facilitate illumination of the LED's. Alternatively, the voltage indicator circuits could be at least partially mounted to an external portion of the housing of a battery pack, or be mounted within a tool that connects to the battery pack and is powered thereby. Moreover, the plurality of LED's, such as LED's CR4–CR6, may function as a motor speed indicator to determine a speed of a motor driven tool since the tool's speed is related to the voltage applied by the battery.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

What is claimed is:

1. A voltage indicator circuit for a DC power source, comprising:
   a switch connected to the DC power source for controlling the voltage applied to the remainder of said circuit;
   a zener diode series connected between said switch and a plurality of series connected resistors;
   a plurality of series connected resistors, one of which is connected to said zener diode;
   a plurality of series connected light emitting diodes, each light emitting diode being connected in parallel with one of said resistors;
   said zener diode scaling the voltage that is applied to said resistors and said light emitting diodes to a predetermined value.

2. The circuit of claim 1 formed as part of a battery pack, wherein the power source is a rechargeable battery.

3. The circuit of claim 2 wherein said rechargeable battery, upon being fully charged, has a voltage less than 30V.

4. The circuit of claim 2 comprising three light emitting diodes for indicating one of a low, medium, and high charge state of said rechargeable battery.

5. The circuit of claim 4 wherein said series connected resistors comprise four resistors in series.

6. The circuit of claim 5 wherein a node is defined at each connection between adjacent resistors, and wherein each of said nodes connects to separate anodes of said light emitting diodes.

7. A device for providing DC power, comprising:
   a battery pack; and
   a battery charge indicator circuit connected to said battery pack to indicate a charge state of said battery pack;
   a switch for controlling a flow of electric power from said battery pack to said battery charge indicator circuit,
   a zener diode connected in series, between said switch and said battery charge indicator circuit for scaling the voltage applied to said indicator circuit;
   said battery charge indicator circuit further comprising:
   a voltage divider circuit formed by a plurality of series connected resistors, the connections between adjacent resistors defining a plurality of respective nodes; and
   a plurality of series connected light emitting diodes each having an anode connected to separate nodes of said voltage divider circuit.

8. The device of claim 7 wherein said battery pack is a rechargeable battery pack.

9. The device of claim 7 wherein said plurality of series connected resistors comprises a first, second, third, and fourth resistors connected to said plurality of series connected light emitting diodes.

10. The device of claim 9 wherein said plurality of series connected light sources comprises:
    a first light emitting diode having an anode connected to the first resistor and a cathode connected to said second and third resistors;
    a second light emitting diode having an anode connected to said second and third resistors and a cathode connected to the third and fourth resistors; and
    a third light emitting diode having an anode connected to said third and fourth resistors and a cathode connected to said fourth resistor and a ground.

11. A battery powered device for supplying power, comprising:
    a battery having first and second terminals;
    a voltage detection circuit, connected to said battery, for detecting a charge state of said battery and having at least two series connected light emitting diodes for generating a visual signal upon a flow of electric current from said battery to said voltage detection circuit;
    a switch for controlling said flow of electric current between said battery and said voltage detection circuit; and
    a zener diode connected in series between said voltage detection circuit and said switch.

12. The device of claim 11 wherein said voltage detector circuit includes at least four resistors connected in series.

13. The device of claim 12 further comprising three light emitting diodes in series and connected to said at least four resistors for generating said visual signal.

14. The device of claim 13 wherein each of said light emitting diodes is connected in parallel to separate resistors of said at least four resistors.

15. The device of claim 11 wherein said battery is a rechargeable battery.

16. A DC power source comprising:

a battery pack; and a battery charge indicator circuit connected to said battery pack to indicate a charge state of said battery pack, said battery charge indicator circuit further comprising:

zener diode connected in series directly between said battery pack and said voltage divider circuit, a zener diode limiting the voltage applied to said voltage divider circuit to a predetermined value;

said voltage divider circuit having a first, second, third, and fourth resistor connected in series;

a first light emitting diode connected in parallel to said second resistor;

a second light emitting diode connected in parallel to said third resistor;

a third light emitting diode connected in parallel to said third resistor; and a switch for controlling a flow of electric power from said battery pack to said battery charge indicator circuit.

17. The power source of claim 16 wherein said first and second resistors connect to an anode of said first light emitting diode.

18. The power source of claim 17 wherein said second and third resistors connect to an anode of said second light emitting diode, and said third and fourth resistors connect to an anode of said third light emitting diode.

19. The power source of claim 18 wherein said second and third resistors connect to a cathode of said first light emitting diode, and said third and fourth resistors connect to a cathode of said second light emitting diode.

20. The power source of claim 19 wherein said fourth resistor connects to a cathode of said third light emitting diode and a ground.

* * * * *